(12) United States Patent
Kaminishi

(10) Patent No.: US 6,683,490 B2
(45) Date of Patent: Jan. 27, 2004

(54) TEMPERATURE DEPENDENT CONSTANT-CURRENT GENERATING CIRCUIT

(75) Inventor: Katsuji Kaminishi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/229,333

(22) Filed: Aug. 27, 2002

(65) Prior Publication Data

US 2003/0080805 A1 May 1, 2003

(30) Foreign Application Priority Data

Oct. 25, 2001 (JP) ....................................... 2001-327579

(51) Int. Cl.[7] ................................................ G05F 1/10
(52) U.S. Cl. ....................................... 327/538; 327/513
(58) Field of Search ................................ 327/538, 539, 327/512, 513, 530; 323/312, 315, 316

(56) References Cited

U.S. PATENT DOCUMENTS 5,625,305 A * 4/1997 Hwang .......................... 327/78
5,986,481 A   11/1999 Kaminishi .................... 327/96
6,037,832 A    3/2000 Kaminishi ................... 327/538

* cited by examiner

Primary Examiner—Terry D. Cunningham
Assistant Examiner—Quan Tra
(74) Attorney, Agent, or Firm—Hogan & Hartson, LLP

(57) ABSTRACT

A reference voltage generating circuit 1 is provided for generating the stable reference voltage Vref against a variation in a supply voltage and an ambient temperature changes. A stabilized voltage generating circuit 2 is provided for generating the stabilized voltage Vg based on the reference voltage Vref. A voltage dividing circuit 4 divides reference voltage Vref. An amplifier circuit 5 amplifies an output voltage of the voltage dividing circuit 4. A current mirror circuit 6 is provided for outputting a current in the opposite direction of the output current of the amplifier circuit 5. A current-voltage conversion resistor 3 is connected between the output terminal of the stabilized voltage generating circuit 2 and the output terminal of the current mirror circuit 6. A buffer amplifier 7 supplies a current feedback type output amplifier circuit 8 with a voltage generated by the resistor 3.

22 Claims, 7 Drawing Sheets

TEMPERATURE DEPENDENT CONSTANT-CURRENT GENERATING CIRCUIT

BACKGROUND OF THE INVENTION

The present invention relates to a constant-current generating circuit and more particularly to a temperature dependent constant-current generating circuit applied to a feed forward type stabilized driving circuit for keeping a light emission characteristic of a light output device composed of a laser diode as a light source such as a optical transmission device or an optical data link.

Optical communications and optical data links have been suddenly widespread in recent years. In the optical transmission device used for these uses generally, a laser diode (LD) is directly modulated in intensity so as to generate a optical signal and the optical signal is transmitted via a transmission medium such as an optical fiber or by propagating through the free space. Particularly, in a transmission module used for a optical data link such as not only a subscriber system such as FTTH (fiber to the home) for use of optical communication at each home but also giga-bit Ethernet, IEEE1394, and optical wiring, the following method is adopted as a method for directly modulating the intensity.

The LD is kept at a DC bias current less than the laser oscillation threshold value in a state where an optical signal is OFF. However, in a state where a optical signal is ON, the LD is brought to a condition where a perfect laser oscillation is obtained, applying a pulse current with an amplitude enough to obtain necessary output intensity, thereby making the intensity ratio of a optical signal in ON and OFF state as large as possible.

When a signal to be transmitted is at a comparatively low frequency, zero bias driving is used, in which the bias current in the OFF state of the LD is perfectly 0. However, when the ON-OFF modulation frequency is increased, simple application of zero bias driving is difficult for the following reason. Assuming a life of carrier decided by the LD to be used as τ, a threshold value of a current in the LD as Ith, the DC bias current to be continuously applied even while the LD is not in operation as Ib, and the driving pulse current amplitude while the LD is in operation as Ip, it is known that the delay time Td from the time when the current is injected to the time when the laser oscillation of the LD takes place is given by the following formula.

$$Td = \tau \times ln(Ip/(Ip+Ib-Ith)) \tag{1}$$

Since τ is generally on the order of nano seconds, it is important to reduce the value of the logarithm term in the above formula to a value as small as possible such as 0.1 or less, when a signal transmission speed of 100 Mb/s or more is required. To satisfy Ib=0 which is a perfect zero bias condition, as well as to realize a value of logarithm term of 0.1 or less, it is necessary to reduce the ratio Ip/Ith to 0.1 or less, that is, to make the value of Ip extremely larger than 10 times of the value of Ith. In other words, the pulse driving current amplitude must be set to a value larger than the value for obtaining the necessary laser intensity amplitude. A problem thus arises that the current driving capacity of the LD driving circuit must be made higher than the value to be required at its minimum so as to obtain the necessary transmission optical signal intensity and that, as a result, the power consumption is increased at the same time.

On the other hand, in the pseudo-zero bias driving system, in which the DC bias current Ib is always applied which is slightly smaller than the threshold value Ith, the ratio Ip/(Ith-Ib) can be set easily to 10 or more, which is more advantageous even if Ip itself is not made large so much. Namely, when the pseudo-zero bias driving system is used, the delay time is reduced, and the high frequency operation is ensured, as well as a large light ON/OFF ratio is obtained and low power consumption can be realized at the same time.

However, a problem still remains that it is difficult for the pseudo-zero bias driving system to control Ib. The reason is that it is known that the threshold value of current Ith at an optional temperature Ti is expressed by the following approximate value, using an intrinsic characteristic temperature $T_0$ of the LD to be used and a threshold value Is when the reference temperature T=Ts:

$$Ith = Is \times exp((T-Ts)/T_0) \tag{2}$$

Exhibiting a characteristic that Ith greatly changes with non-linearly for a temperature change. For example, the value $T_0$ of an InP series LD is several tens to 100, so that the threshold change is close to several times to 10 times for a temperature change of 100 degrees. Further, even in a case of a GaAs series LD which is knnwn to have a characteristic of comparatively low temperature dependence within the range from the room temperature to about 70° C., a constant term of Ic may be added to the right side of Formula (2) to increase accuracy in the approximation within the temperature change ranging from −40° C. to 100° C. It is known that thus compensated value of $T_0$ shows the same value as that of an InP series element. In consideration of the above, it is essential for the DC bias generating circuit itself to have large temperature dependence in the same way as with Ith to make the value of Ib for realizing a pseudo-zero bias follow Ith and keep the difference between them to be substantially constant.

In the art prior to the disclosure of Japanese Patent Application Laid-Open 11-103108 applied by the applicant and shown in FIG. 1, a simple bias current generating circuit which can accurately follow temperature changes of the threshold current Ith and can be applied to LDs having various different characteristics was not realized. For example, a system for searching for the inflection point, at which a DC bias current is fixed, in the neighborhood of the threshold current by checking the differential value of a DC bias current, and a system for monitoring the intensity of actually emitted light of the LD, which is fed back to a DC bias are known as a compensation system of threshold bias current of LD. These systems require a large-scale detecting and feed backing circuit, so that it is almost impossible to apply them to uses requiring a compact one-chip IC such as LD driving circuits for the optical data link.

On the other hand, it is known that not only the threshold value Ith but also the light intensity emitted of the LD have temperature dependent characteristics, which is expressed by an exponential function decreasing with temperature, assuming the characteristic temperature $T_0'$ as a constant. Since the value of $T_0'$ is large compared with $T_0$ and is generally several hundreds, temperature compensation of the light intensity emitted is often required even though it changes slightly unlike the case with the threshold value. In the conventional optical communication, an APC (automatic power control) circuit for keeping the light intensity emitted from the laser constant is used to keep the magnitude of a optical transmission signal constant and to prevent deterioration in quality of the signal transmitted. A large-scale APC circuit for monitoring a part of output of the LD by a phase detector (PD) and feeding it back is generally used to realize severe control by active feedback.

Further, due to an improvement in uniformity and stability of physical characteristics of LD, in recent years, a feed forward type stabilizing circuit is used on a assumption that the temperature dependent characteristic of LD is regarded as almost constant. Namely, as a method for a simple temperature compensation of the light intensity emitted from LD, stabilization using a control system for applying passive feed forward is adopted.

Such a temperature compensation system of light intensity emitted from the LD in the feed forward type APC circuit is exemplary shown in Japanese Patent Application Laid-Open 3-21493.5 and Japanese Patent Application Laid-Open 8-139410. Following systems have been designed by confirming the characteristics of LD beforehand.

(1) a system for making rough approximation using the temperature dependence of a diode in an IC,
(2) a system increasing the approximate accuracy comparatively by selecting a thermistor,
(3) a system for approximating the characteristics by broken lines, switching several kinds of resistors and
(4) a system for storing LD characteristics in a memory and severely adjusting them using a D-A converter.

Further, as disclosed in Japanese Patent Application Laid-Open 7-76287, there is a system combining a voltage source obtained by deforming a band gap reference power source, an emitter follower, and a current feedback amplifier. However, problems are remained in the above systems that compensation characteristics for temperature change are insufficient, that the temperature range is limited, that there are many parts for adjusting the characteristics, and that the adjustment itself is complicated. Further, even in a system having few of the above problems that there are disadvantages that a complicated circuit is required instead, that the chip area is increased, and that it is applicable to a specific LD but is not applicable to an LD having a slightly different characteristic temperature.

Japanese Patent Application Laid-Open 11-103108 relating to the invention of the inventor of this application shown in FIG. 1 indicates a strong improvement for the above various problems.

As shown in the drawing, the reference voltage generating circuit 1 generates a reference voltage Vref by using, for example, a band gap voltage reference power source of a basic circuit construction. A voltage generating circuit 2 generates a reference bias voltage Vg, which is higher than Vref the voltage and is as stable as the voltage Vref. The value of Vg is slightly lower than the voltage for generating a current Is of a desired value at the reference temperature Ts and is selected at a value, which is lower by the voltage appeared across a reference resistor RG supplied with a current given at an ambient temperature.

A voltage dividing circuit 4 and a current generating circuits 5 are provided.

The voltage dividing circuit 4 is composed of resisters R1, R2. The current generating circuit is composed of an emitter grounded type amplifier circuit including an npn transistor Q1 and a resistor R3 connected to an emitter electrode thereof. The current generating circuit 4 provides a collector electrode of the transistor Q1 with a current varying with an exponential function depending on a variation in an ambient temperature. The reference voltage is supplied to a base electrode, by being reduced and divided by the resistors R1 and R2. The current mirror circuit 6 designed for the purpose of ejecting a current from the plus side of the power source can realize an operation having good linearity even when it has a simple construction composed of of PNP transistors Q2 and Q3 which are complementary to Q1 and a resistor R6. The current reversed by the current mirror circuit 6 is supplied to the reference resistor RG, which generates at its both ends a voltage, which is a sum of a component voltage Vg independent from the temperature and a component voltage strongly dependent on temperature. Since an output impedance of the voltage generating circuit 2 at the end of the current-voltage conversion resistor RG, into which the current is supplied from the current mirror circuit 6, is almost as large as the value of RG, the output voltage is supplied via the buffer amplifier circuit 7 having a gain of 1, thereby lowering the output impedance.

The output voltage of the buffer amplifier circuit 7 is supplied to a base electrode of a transistor Q4 of an output amplifier 8, which is a current feedback type amplifier having a resistor R4 connected to an emitter electrode. An output current is obtained from a collector electrode of the transistor Q4, which is connected to the load.

FIG. 2 comparatively shows the results of the simulation of DC bias current and its approximated exponential function for a design example using a Si bipolar. It is found that the simulation results satisfactorily correspond to the exponential offset function of Formula (1) within the temperature range of 100° C. with an error range of 0.2 mA or less, just by setting the characteristic temperature $T_0$ within the range from 45° C. to 58° C. and by changing the RG resistance in three kinds. However, the method does not cover sufficiently the temperature range, although not shown in the drawing, of less than 0° C., which is required for communication industry. In addition, an approximation error of about 0.2 mA cannot be avoided yet, although it is particularly improved compared with the previous method. Recently, the development of the LD having lower threshold value has been promoted, where a current of several mA is generally obtained. However, it is difficult to compensate the DC bias always up to 1/10 or less of the threshold current due to an accuracy of the approximation of the generated current, thereby bringing a limitation in lower power consumption.

As described above, the pseudo-zero bias driving system requires a circuit for generating a DC bias current for faithfully following the temperature dependent characteristic of the threshold current of LD changing with great dependency on the temperature on an exponential function basis. The reason for it is that the system keeps flowing a fixed DC bias current, which slightly smaller than the threshold value in an LD so as to reduce the oscillation delay time, to ensure the high frequency operation and to ensure a large ON/OFF ratio at the same time to realize a high-speed optical data link. However, in the prior art, it is difficult to realize such a DC bias current generating circuit. Moreover, the temperature compensation can be applied only to an LD having a specific characteristic and a large-scale detection-feedback circuit is required. Thus, a problem arises that the cost is increased on one hand and miniaturization is essentially difficult on the other.

Further, in the prior feed forward type APC circuit, various systems for executing temperature compensation of the light intensity emitted of the LD are proposed. However, problems aroused in the above systems that compensation characteristics for temperature change are insufficient, the temperature range is limited, that there are many parts for adjusting the characteristics, that the adjustment itself is complicated, and that a complicated circuit is required. Thus the chip area is increased and is applicable to a specific LD but is not applicable to an LD having a different characteristic temperature.

Therefore, the present invention was developed to solve the above conventional problems and is intended to provide a temperature dependent constant-current generating circuit, which is small in size with a low-price, which faithfully follows temperature changes of a threshold current of an LD, which generates a DC bias current having particularly excellent in the accuracy in the temperature compensation characteristic, which can be widely applied to an LD driving circuit of a optical subscriber system of FTTH or a optical data link, and which can be applied also to temperature compensation of the intensity of the output from the LD.

SUMMARY OF THE INVENTION

To solve the above problems, the temperature dependent constant-current generating circuit according to the present invention has a stabilized voltage generating circuit including a reference voltage source for supplying a predetermined reference voltage, a plurality of voltage dividing circuits for dividing the reference voltage, a plurality of current amplifier circuits each of which includes a transistor whose base or gate is connected to an output terminal of the voltage dividing circuit and whose emitter or source is grounded, a current mirror circuit for providing an output current flowing in an opposite direction having a same magnitude as a composite output currents of the current amplifier circuits, a current-voltage conversion resistor, which is provided with the output current of the current mirror circuit, thereby generating a voltage proportional to the output current of the current mirror circuit, and which add the voltage proportional to the output current of the current mirror circuit to an output voltages of the stabilized voltage generating circuit, and an output amplifier circuit to which the added voltages generated by said current-voltage conversion resistor are supplied. The output amplifier circuit is composed of an output transistor, having a base or gate electrode, an emitter or source electrode and a collector or drain electrode. The added voltages generated by the current-voltage conversion resistor are supplied to the base or gate electrode. A feedback resistor is connected to an emitter or source electrode. An output current is taken out from the collector or drain electrode of the output transistor.

The reference voltage is kept constant against a variation in a supply voltage or in an operation temperature, while the stabilized voltage generating circuit is set to a voltage which is higher than the reference voltage, but slightly lower than the output voltage of the constant-current generating circuit for generating an output current of a desired value at the reference temperature. Namely, the output voltage of the stabilized voltage generating circuit is lower by the voltage generated across the current-voltage conversion resistor by the current provided by the current mirror circuit depending on the temperature at use.

More specifically, the output of the stabilized voltage generating circuit, which is independent from a temperature, is applied to one end of the current-voltage conversion resistor. On the other end of the current-voltage conversion resistor, a voltage, which is converted from the current generated from the current mirror circuit by the current-voltage conversion resistor and is dependent on a temperature, is generated in addition to the output voltage of the stabilized voltage generating circuit. In the current amplifier circuits, on the other hand, a voltage obtained by dividing the reference voltage by the voltage dividing circuit is added to the base or gate of the transistor. A current, the magnitude of which varies depending on a temperature with an exponential function is taken out from the collector or drain of the transistor. The output current flows into the voltage conversion resistor from the other end through the current-miller circuit.

As described above, a voltage is generated with which an output current of a desired value is generated from the constant-current generating circuit at the reference temperature and with which a current varying with an exponential function depending on a temperature other than the reference temperature is generated at the end of the current-voltage conversion resistor, into which the current from the current mirror circuit is flowing. Therefore, when the voltage generated at the current input end of the current-voltage conversion resistor is applied to the base or gate of the output transistor of the output amplifier circuit via the buffer amplifier circuit, an output current is taken from the collector or drain of the output transistor, which has a desired value at the reference temperature, varying depending on the temperature with an exponential function, and which is required for temperature compensation. The output current is supplied to a load connected to the collector or drain of the output transistor.

In this case, the voltage generated at the end of the current-voltage conversion resistor is supplied to the output circuit through a buffer amplifier, which is an amplifier having a gain of 1 and reducing an input impedance to the amplifier circuit, thereby preventing the input voltage of the output amplifier circuit from being affected by variation of a load of the output circuit.

The constant-current generating circuit according to the present invention generates an output current having a desired current at the reference temperature and changing with an exponential function depending on a temperature variation. Therefore, when it is applied to a LD driving circuit, it is able to provide a LD with a DC bias current, which always follows temperature variations of the threshold value current of a LD and which is slightly smaller than the threshold value current with good preciseness. Therefore, the pseudo-zero bias driving can be realized, which is conventionally difficult to realize.

Further, the constant-current generating circuit according to the present invention adopts a multiple current source construction, in which two or more current generating circuits are used for deciding a non-linear characteristic of the output current, and the composite current of the current generating circuits is finally converted to a voltage. Accordingly, a temperature dependent constant current circuit is obtained, with which the approximation to the non-linear characteristic is made with higher preciseness and the characteristic temperature $T_0$ can be changed in a wider range compared with the conventional single source construction, in which a single current generating circuit is used. As a result, a DC current for pseudo-zero bias can be brought very close to the laser oscillation threshold value and the excessive over-drive current to speed up an operation is unnecessary, thereby decreasing an amplitude of a driving current for pulse modulation. According to a rough estimation, the current consumption can be reduced to a half or less of the conventional one. Further, regardless of a single or the multiple current source construction, it is possible that a component of the output current depending on a temperature and an offset component independent from the temperature can be set independently by selecting the relation between a stabilized voltage of the stabilized voltage generating circuit and a voltage across the current-voltage generating resistor in a manner described above.

Further, the voltage dividing ratio of the voltage dividing circuit is decided by the absolute value of the reference voltage, the characteristics of the current amplifier circuit (for example, voltage between the base and the emitter of the transistor), the resistance of the current-voltage conversion resistor, and the temperature dependence (characteristic temperature) of the output current from the constant-current generating circuit. However, among them, the values other than the characteristic temperature can be considered as fixed values. The characteristic temperature of the output current, thus, can be adjusted optionally by properly adjusting the voltage-dividing ratio. Namely, when the reference voltage and current-voltage conversion resistance are decided, it is possible to change the temperature dependence (characteristic temperature) of the output current by adjusting the voltage-dividing ratio of the voltage circuit. Further, the temperature dependence (characteristic temperature) of the output current can be also adjusted by adjusting the current-voltage conversion resistance.

Furthermore, since a current mirror circuit having a current amplifying operation can be provided by designing the size of the transistor constituting the current mirror circuit on the output side is larger than the size of the transistor on the input side, the expected operation can be realized even when the output current of the source current amplifier circuit is small.

In the temperature dependent constant-current generating circuit according to the present invention, except the current mirror circuit, the current amplifier circuit including the transistor, in which base or gate electrode is connected to the output terminal of the voltage dividing circuit and emitter or source electrode is grounded may be used as a current discharge type circuit. Thus, the current-voltage conversion resistor may be connected to the output terminal of the current discharge type current amplifier circuit.

Furthermore, according to the present invention, an amplifier circuit of an emitter follower or a source follower circuit, in which a collector or drain electrode is grounded, may be inserted between the output terminal of the buffer amplifier circuit and a base or gate electrode of the output amplifier. Thus, with the current amplification function of the added amplifier circuit, the stability of the output amplifier circuit is maintained and the output current can be increased. Since the amplifier circuit added varies the temperature dependent characteristic of the output current, the temperature dependence of a voltage generated at the current-voltage conversion circuit must be optimized again.

Further, an array output type constant-current generating circuit can be prepared and in this case, each added amplifier circuit may be equipped with an isolation function between the channels of array output by providing a plurality of the combined circuits including the amplifier circuit inserted between the buffer amplifier circuit and the output amplifier circuit.

DESCRIPTION OF THE PREFERRED EMBODIMENTS

Figure 3:
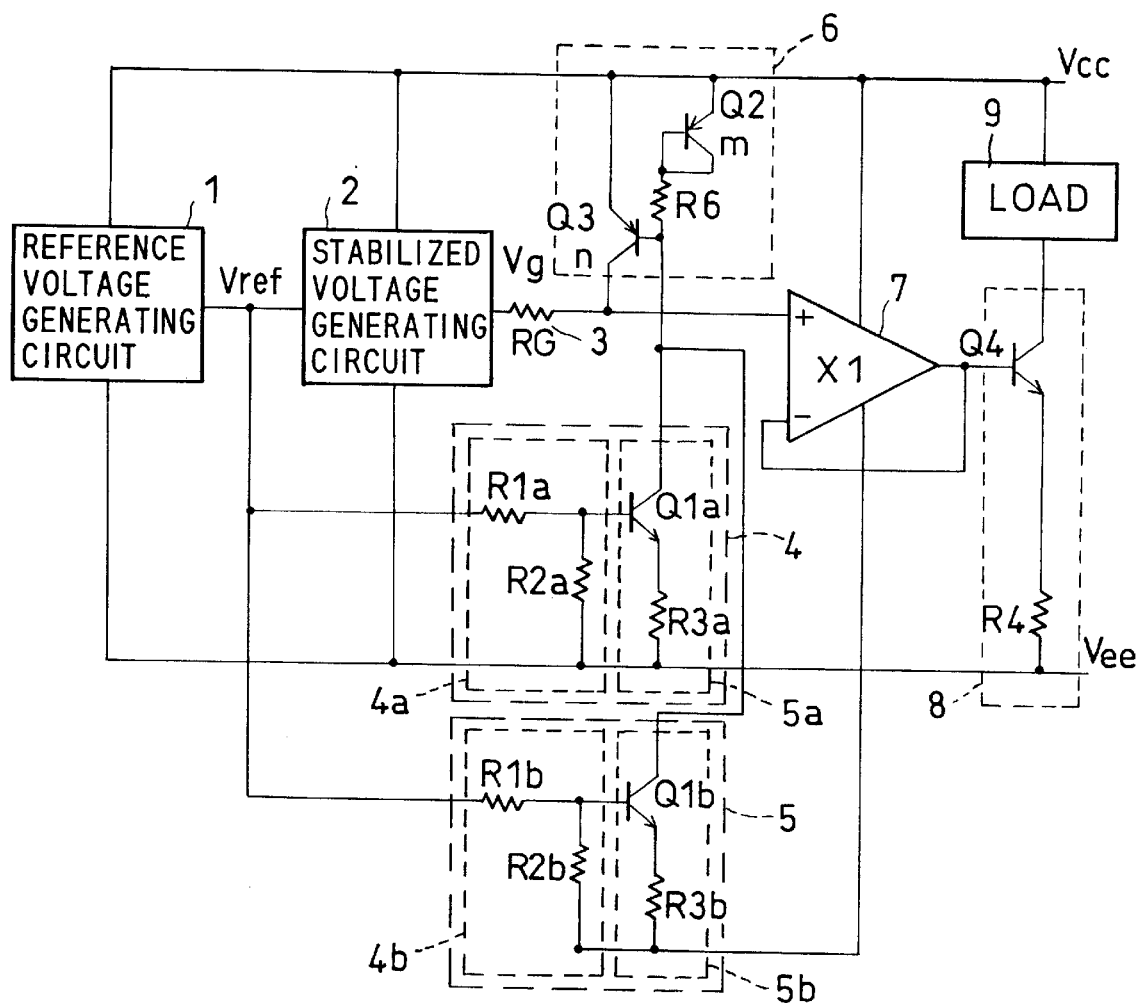
FIG. 3 is a block diagram of a temperature dependent constant-current circuit showing a first embodiment according to the present invention.

The preferred embodiments according to the present invention will be explained hereunder with reference to the drawing attached. FIG. 3 is a block diagram showing a first embodiment of the temperature dependent constant-current generating circuit according to the present invention. As shown in the drawing, the reference voltage generating circuit 1 generates a reference voltage Vref by using, for example, a band gap voltage reference power source of a basic circuit construction. Using the circuit disclosed in the patent application (Japanese Patent Application Laid-Open 10-268954) filed by the applicant of the present invention, the stability against variation of the power source can be enhanced. In an example using a Si semiconductor, a stable voltage of about 1.2 V is obtained for a reference point of the ground and a voltage sufficiently is provided, which is larger than the forward voltage between a base and an emitter electrode of a npn transistor. A voltage generating circuit 2 generates a reference bias voltage Vg, which is higher than Vref the voltage and is as stable as the voltage Vref. The value of Vg is slightly lower than the voltage for generating a current Is of a desired value at the reference temperature Ts and is selected at a value, which is lower by the voltage appeared across a reference resistor RG supplied with a current at an ambient temperature.

At least two sets of current generating circuits 4 and 5 are provided. The first set 4 is a current generating circuit for mainly controlling the temperature dependence in the low temperature region and the second set 5 is a current generating circuit for mainly compensating a variation from a desired characteristic in the high temperature region which cannot be controlled by the first set 4.

The first set of current generating circuit 4 is composed of a first voltage dividing circuit 4a including resistors R1a, R2a and an emitter grounded type amplifier circuit 5a including an npn transistor Q1a and a resistor R3a connected to an emitter electrode thereof. The current generating circuit 4 provides at a collector electrode of the transistor Q1a with a current varying with an exponential function depending on a variation in an ambient temperature. The reference voltage is supplied to a base electrode, by being reduced and divided by the resistors R1a and R2a. The reduction rate is decided depending on the absolute value of the reference voltage, the forward voltage between the base and emitter electrodes of the transistor Q1a, the value of reference resistor Rg and a characteristic temperature for specifying a temperature variation of a current to be finally obtained in the low temperature region. Actually, since the values except for the characteristic temperature can be considered as fixed values, the characteristic temperature can be adjusted optionally by properly adjusting the ratio of the voltage-dividing resistor. The values of R1a and R2a are designed so as to allow a bias current to flow, which is at least five times as large as the maximum base current of the transistor Q1a. When the LD characteristics are measured accurately, the resister ratio is decided so as to accurately approximate a desired temperature dependent characteristic of the constant-current output within the whole operating temperature range as far as possible. Particularly the ratio is decided so as to optimize in the low temperature region by taking a serious consideration on the accuracy of the approximation. Generally, to obtain an accurate approximation result of the characteristic having large non-linearity, the current feedback type amplifier having R3a of a finite value can obtain a better result than the perfect emitter grounding type amplifier having R3a of 0. For a typical transistor, the value of R3a is within the range from 100 Ω to 5 kΩ.

Then, the second set of current generating circuit 5 is composed of a second voltage dividing circuit 4b including resistors R1b, R2b and an emitter grounded type amplifier circuit 5b including an npn transistor Q1b and a resistor R3b connected to an emitter electrode thereof. The current generating circuit 5 provides a collector electrode of the transistor Q1b with a current varying with an exponential function depending on a variation in an ambient temperature. The reference voltage is supplied to a base electrode, by being reduced and divided by the resistors R1b and R2b. The reduction rate is decided depending on the absolute value of the reference voltage, the forward voltage between the base and emitter electrodes of the transistor Q1b, the value of reference resistor RG and a characteristic temperature for specifying a temperature variation of a current to be finally obtained in the low temperature region. Actually, since the main temperature dependence in the low temperature region is decided by the current generating circuit 4, the ratio of the values of the voltage dividing resistors R1b and R2b is adjusted and selected properly so as to obtain a voltage lower than that of the circuit 4. The output current of the amplifier circuit 5 is generated so as to compensate the temperature change, which cannot be followed by the circuit 4 in the high temperature region. The characteristic temperature is optionally and accurately adjusted by a combination of the circuits 4 and 5. The values of resistors R1b and R2b are selected to a value, which allows a bias current ten times as large as the maximum current of the base electrode of the transistor Q1b or more to flow. When the LD characteristics are measured accurately, the ratio of the resistors is decided so as to approximate a desired current output characteristic accurately within the whole operation temperature range if possible. Since the current in the low temperature region is originally small and the absolute value of a variation is also small, a slight difference of the characteristic temperature is matured to a big difference mainly in the high temperature region. To compensate the difference, the resister ratio is thus decided as an optimal value taking the accuracy of the approximation in the high temperature region into serious consideration. In the same way as with the current generating circuit 4, the current feedback type amplifier having R3a of a finite value can obtain a better result than the perfect emitter grounding type amplifier having R3a of 0 to obtain an accurate approximation result of the characteristic having large non-linearity. For a typical transistor, the value of R3a is within the range from 300 Ω to 20 kΩ.

As described above, when the ratio of the resister R1x to R2x, where x is a or b, varies, the characteristic temperature of the output current varies too. Further, when the ratio is fixed, it is found that by increasing the value of reference resister RG, only the characteristic temperature rises. Further, for the general variation of the LD characteristic, it is found that tuning can be possible by adjusting only the ratio of R1b to R2b with the values other than R1b and R2b being fixed.

Figure 4:
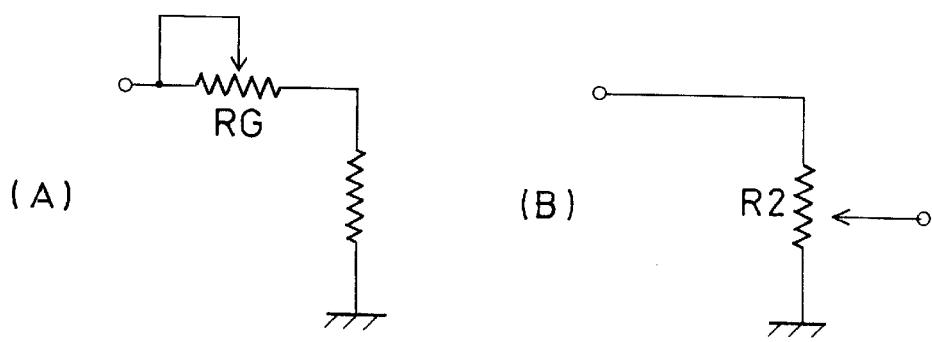
FIG. 4 is a circuit diagram showing a circuit, with which a part of the circuit shown in FIG. 3 can be replaced.

FIG. 4(A) shows an embodiment that the value of RG is variable to vary the characteristic temperature. FIG. 4(B) shows an embodiment that the resister ratio of R1x to R2x is variable to vary the characteristic temperature.

The current mirror circuit 6 designed for the purpose of ejecting a current from the plus side of the power source can realize an operation having good linearity even when it has a simple construction composed of of PNP transistors Q2 and Q3 which are complementary to Q1x, where x is a orb, and a resistor R6. Needless to say, a high performance current mirror circuit may be prepared by increasing the number of elements. When a current generated from Q1x is small, the current is amplified proportionally by making a size n of the transistor Q3 larger than the size m of the transistor Q2, thereby generating a large current. The current reversed by the current mirror circuit 6 is supplied to the reference resistor RG, which generates at its both ends a voltage, which is a sum of a component voltage Vg independent from the temperature and a component voltage strongly dependent on temperature. Since an output impedance of the voltage generating circuit 2 at the end of the current-voltage conversion resistor RG, into which the current is supplied from the current mirror circuit 6, is almost as large as the value of RG, the output voltage is supplied via the buffer amplifier circuit 7 having a gain of 1, thereby lowering the output impedance.

The output voltage of the buffer amplifier circuit 7 is supplied to a base electrode of a transistor Q4 of an output amplifier 8, which is a current feedback type amplifier having a resistor R4 connected to an emitter electrode. Since the collector output current is usually desirable to have large temperature dependence and a temperature dependent characteristic varying with an exponential function, the current feedback resistor R4 is not necessarily very large. The value of the resister, thus, is selected as a product of the value of the resister and the amplitude of the current flowing there may fall within the range from 0.1 to 2.0 ΩA. An output current is obtained from a collector electrode of the transistor Q4, which is connected to the load.

In the embodiment shown in FIG. 3, it is possible to remove the buffer amplifier 7 and to connect the joint of the collector electrode of the transistor Q3 and the current-voltage conversion resister RG directly to the base electrode of the transistor Q4. This embodiment is effective when the base current of the transistor Q4 is small enough to be ignored compared with the collector current of the transistor Q3 or when the ratio of those currents is almost constant. The modification contributes to miniaturization of the circuits and reduction in current consumption.

The output circuit shown in FIG. 3 is an example, in which the output current is small and which is composed of a single stage transistor amplifier. The second embodiment of the present invention shown in FIG. 5 can be applied when a large output current is required. Between the buffer amplifier circuit 7 and the output transistor Q4 of the final stage in the first embodiment, an emitter follower circuit 10 composed of a transistor Q5 and a resistor R5 is inserted. Thus, a satisfactory characteristic can be realized in the same way as with the first embodiment. With the circuit configuration, not only a large output current can be obtained but also an array output type constant-current generating circuit can be realized by providing the output of the buffer amplifier with a multi-stage of output circuits each of which includes the output circuits subsequent to the emitter follower circuit. The emitter follower circuit in this case fulfills not only a current amplification but also isolation between the channels of array output.

Figure 5:
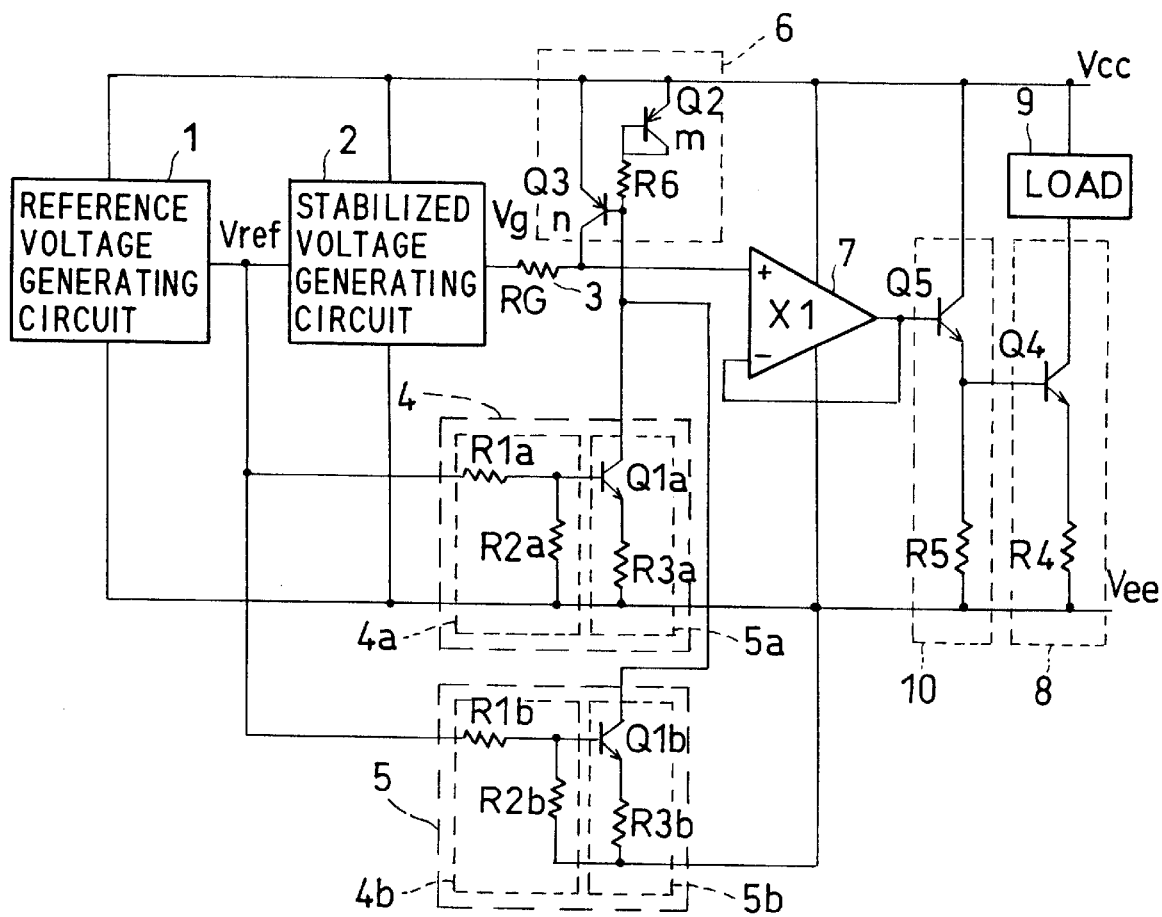
FIG. 5 is a block diagram of a temperature dependent constant-current circuit showing a second embodiment according to the present invention.

The embodiment shown in FIG. 5 has a substantially same configuration with that of shown in FIG. 3 except for some parts described above. Thus specific explanation is omitted by simply assigning corresponding symbols to parts shown in FIG. 5 corresponding to those in FIG. 3.

Figure 6:
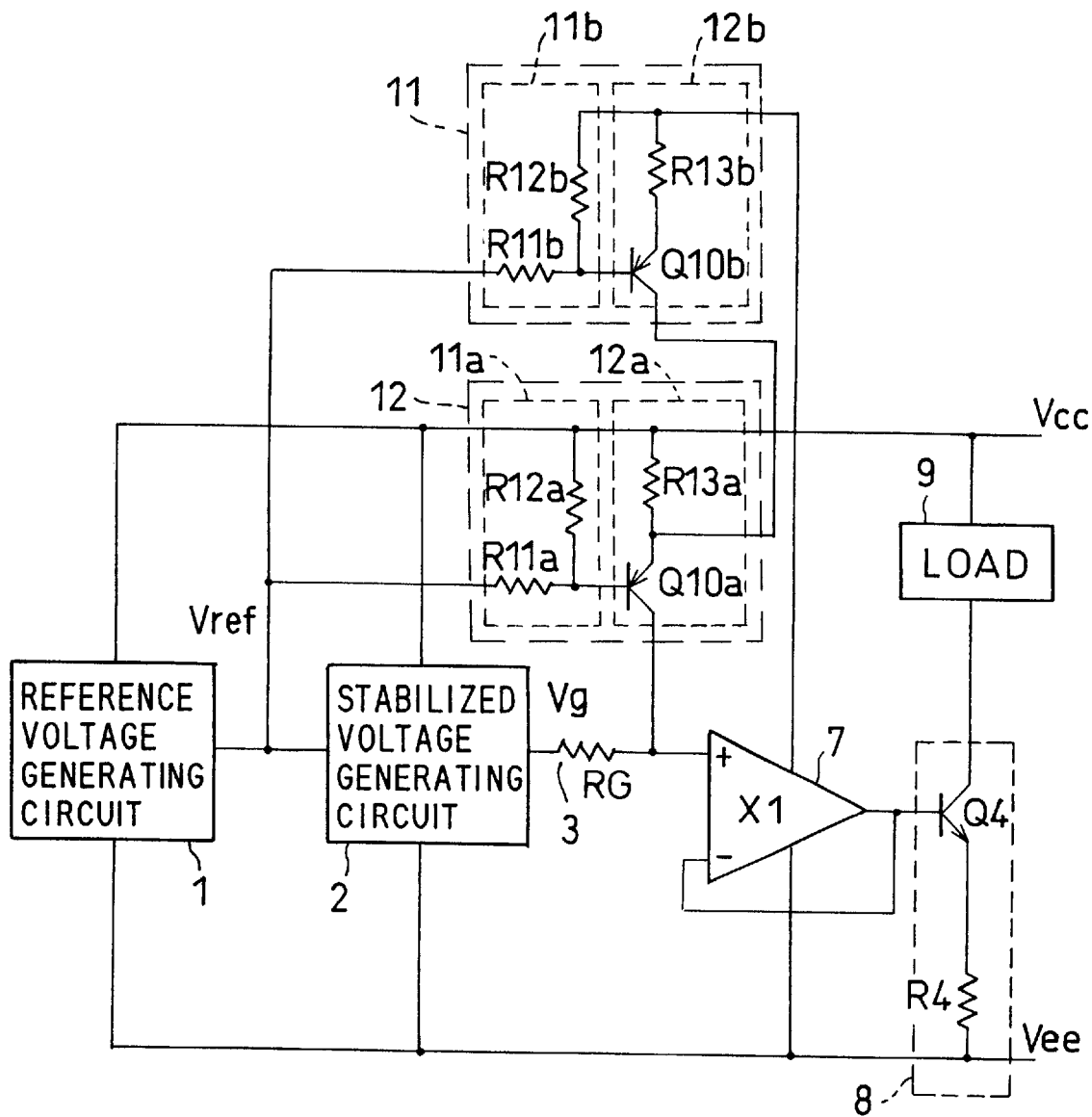
FIG. 6 is a block diagram of a temperature dependent constant-current circuit showing a third embodiment according to the present invention.
Figure 7:
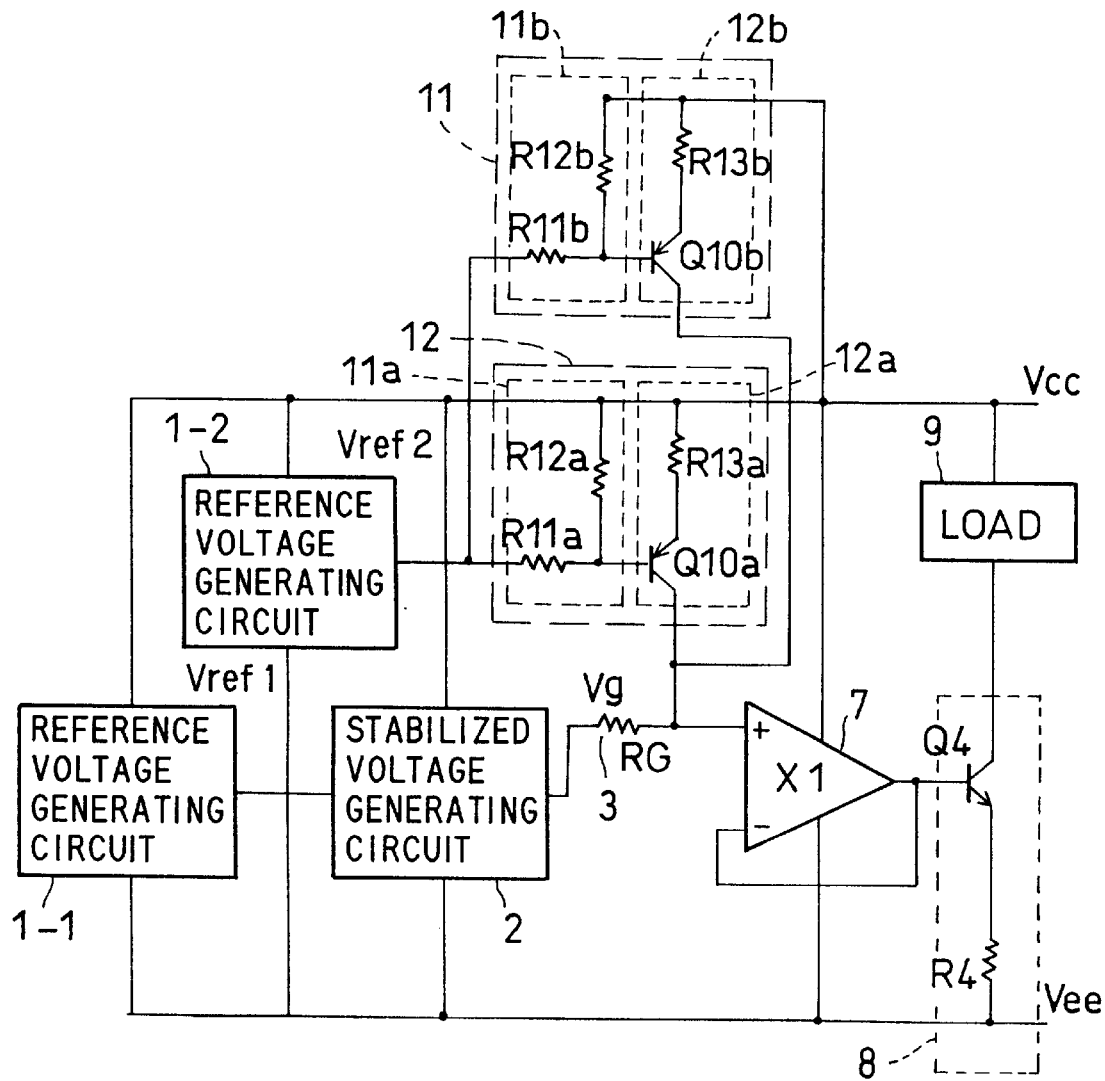
FIG. 7 is a block diagram of a temperature dependent constant-current circuit showing a fourth embodiment according to the present invention.

FIGS. 6 and 7 show the third and fourth embodiments of the present invention respectively. Both embodiments use a first and second current generating circuit 11 and 12 for ejecting a current directly by complementary pnp transistors Q10a and Q10b instead of the current mirror circuit 6 in the embodiments shown in FIGS. 7 and 3. The circuits 11 and 12 have basically a same circuit configuration as the current generating circuit 4 or 5 except that a complementary transistor Q10a or Q10b replaces the transistor Q1a or Q1b as well as resisters R11a, R11b, R12a, R12b, R13a and R13b replace the resisters R1a, R1b, R2a, R2b, R3a and R3b. The third embodiment can be useful only when the power source is kept stable, while in the fourth embodiment provides the characteristics close to those of the first and second embodiments even when the power source is varied, since a reference voltage generator Vref2 is provided, which is complementary to Vref1 and referring to a plus voltage of the power source.

Further, as mentioned above, it is possible to remove the buffer circuit 7 in each embodiment shown in FIGS. 6 and 7 and to connect the joint of the collector electrode of the transistor Q10x and the resistor RG directly to the base electrode of the transistor Q4.

The embodiments shown in FIGS. 6 and 7 have substantially the same configuration as that shown in FIG. 3 or 5 except for some parts described above. Thus specific explanation is omitted by simply assigning corresponding symbols to parts shown in FIGS. 6 and 7 corresponding to those in FIG. 3 or FIG. 5.

Figure 8:
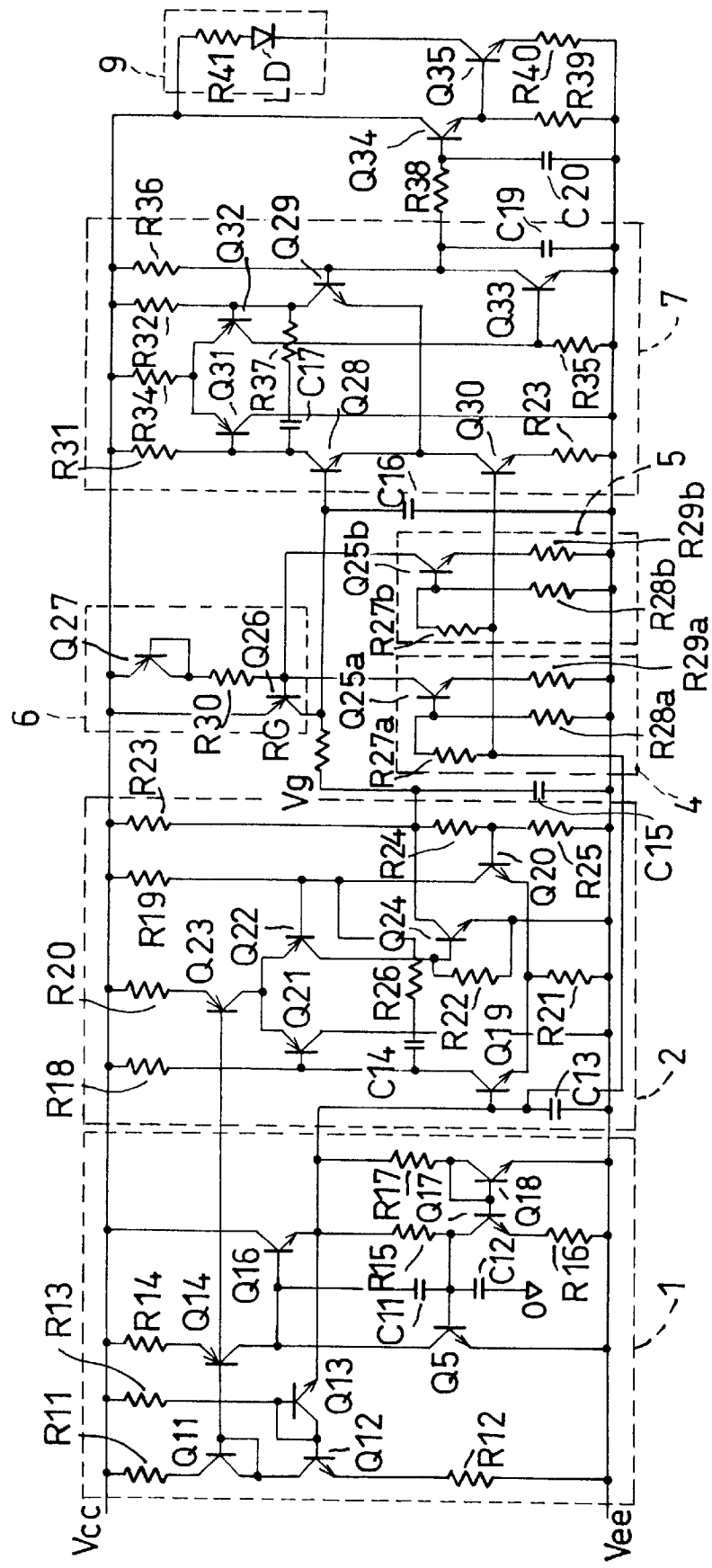
FIG. 8 is a circuit diagram of the temperature dependent constant-current circuit according to the present invention, which is shown with more specific form.

FIG. 8 shows a temperature dependent constant-current generating circuit concretely designed according to the embodiment of the present invention. The reference voltage generating circuit 1 uses the band gap reference voltage source, which is improvement of the source disclosed in Japanese Patent Application Laid-Open 10-268954. The second stabilized power source circuit 2 is composed of a combination of a two-stage differential error amplifier, an emitter grounding type amplifier and a load R23. The circuit 2 provide a voltage of $Vg=(1+R24/R25) \times Vref$, which is as stable as the output voltage Vref of the reference voltage generating circuit 1. The buffer amplifier 7 of a gain of 1 has the same circuit configuration as that of shown in FIG. 3 or 5. The value of a resistor R36 has a small value so that a current larger than the current flowing into the base electrode of a transistor Q34 always flows, thereby preventing the transistor Q33 from being cut off.

A high frequency cut-off filter composed of a resistor R38 and a capacitor C20 is provided at the base electrode of the transistor Q34 forming the emitter follower circuit. It is generally effective in suppressing high frequency noise in an output current. In addition, particularly for the array output, it effectively suppresses a high frequency cross talk between the channels. At a collector electrode of an output transistor Q35, Load 9 is indicated, which is composed of an LD and a resistor. However, instead of a combination of an LD and a resistor, either one of the LD or the resistor may be connected.

Figure 1:
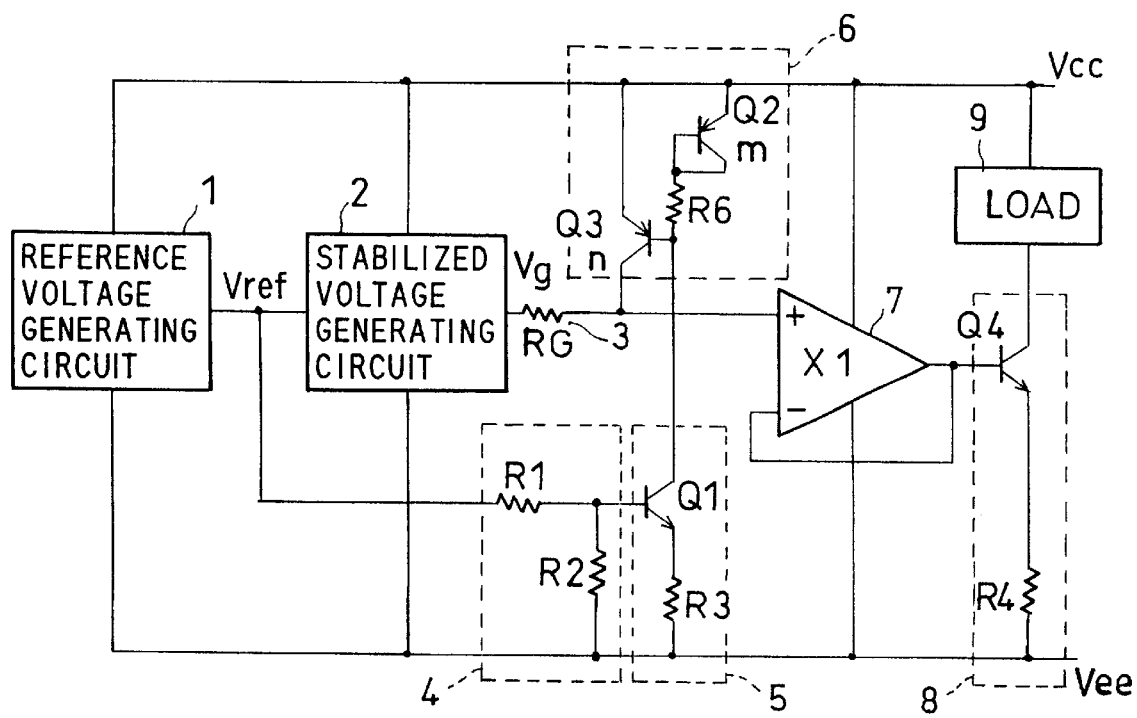
FIG. 1 is a block diagram showing an example of a conventional temperature dependent constant-current circuit.
Figure 2:
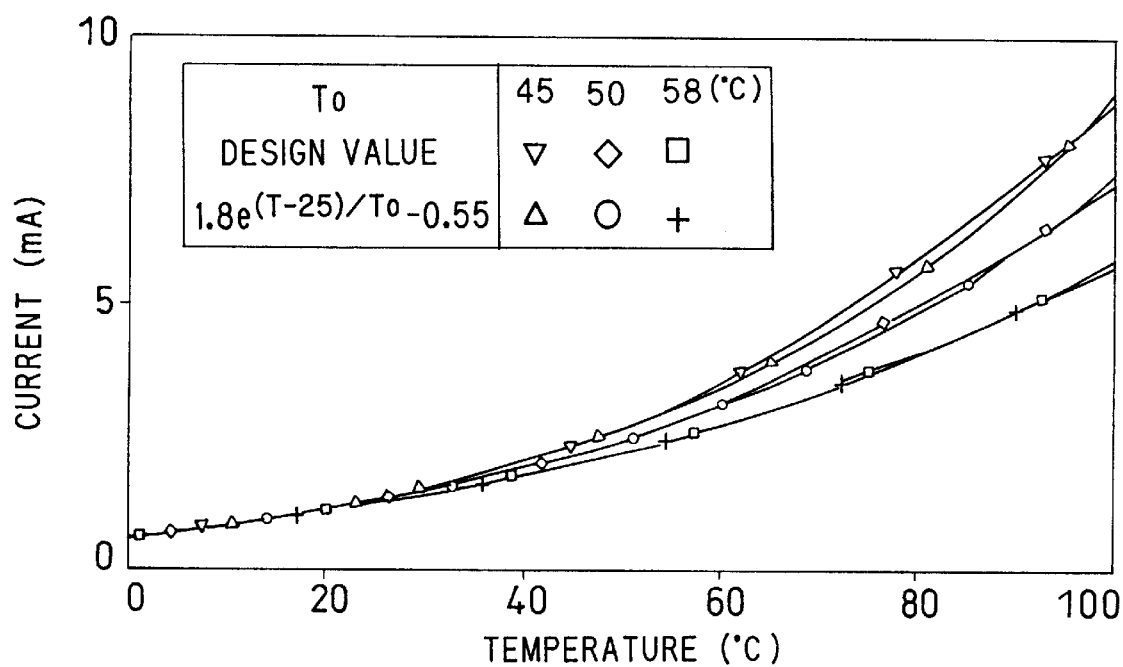
FIG. 2 is a graph showing characteristics of an output current of a conventional temperature dependent constant-current circuit.
Figure 9:
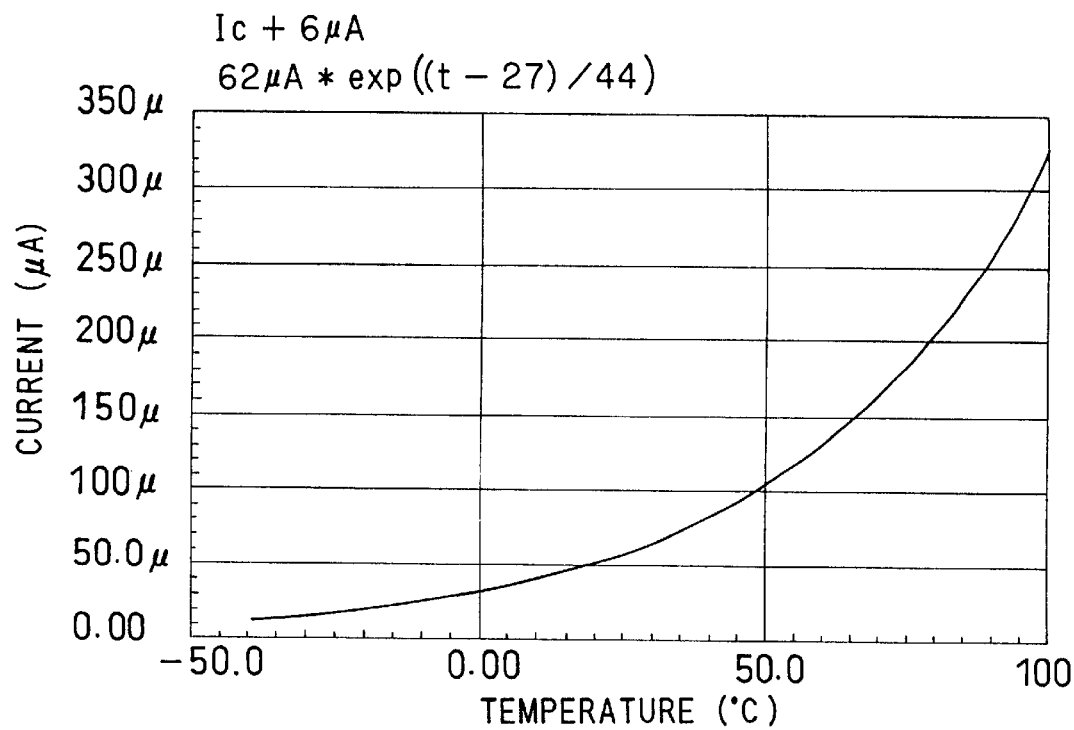
FIG. 9 is a graph showing comparatively showing a result of a simulation of a DC bias current supplied by the circuit shown in FIG. 8 and a theoretically approximated exponential function of the DC bias current.

With respect to the circuit using an Si bipolar transistor shown in FIG. 8, simulation of DC bias current output was carried out and results were compared with the theoretically approximated exponential function. The results are shown in FIG. 9. The thick line indicates the exponential function and the fine line indicates a value obtained by adding 6 $\mu$A to the output current. Although the characteristic temperature T0 has a small value such as 44° C., there is little displacement over the range from −40° C. to 100° C. When the output current is amplified using a current mirror circuit of an amplification factor of about 30, the current showed almost the same characteristic as that of T0=45° C. shown in FIG. 2, though the accuracy in the non-linear approximate characteristic is clearly different.

The characteristic obtained by the simulation was compared with the characteristic based on the theory with a GaAs LD having a low threshold value and oscillating at a wave length of 650 nm connected as an actual load 9. A displacement of the threshold value of the LD itself from the exponential function is observed in the high temperature region, though they can coincide with each other within a difference of 0.1 mA by adjusting the circuit constant. When the LD and IC chip are kept at the same temperature by mounting them on a carrier having good heat conductivity, it is understood that the constant-current generating circuit shown in FIG. 8 provides a pseudo-zero bias with considerable preciseness.

Further, it is also ascertained that the temperature compensation of an output light intensity is possible by setting the characteristic temperature at several hundreds ° C. with a parameter of the circuit being adjusted, and by applying the circuit to a constant-current generating circuit for the driving circuit of array type LD having 12 channels providing pulse current output of several tens mA. Further, the above circuit can be applied also to array output and the chip size can be made sufficiently small to be incorporated into an one chip IC including a laser driving circuit.

The above explanation has been made with a configuration, in which two sets of current generating circuits are used. However, the accuracy in the approximation of the non-linear temperature dependency of the final current output can be more improved, if three or more sets of current generating circuits are used. However, it is not advisable to increase the number of stages since the circuit scale is inevitably increased and some variations in a manufacturing process are unavoidable if the number of stages is increased. It is ascertained that up to three sets of current generating circuits are effective by an experiment on the actual effect.

In the above explanation, Vee indicates the ground potential and Vcc is the positive potential of the power source. However, it is obvious that Vcc may be the ground potential and Vee may be a negative potential of the power source without diverting from the object of the present invention. Further, in the present invention, it is also obvious that the npn type bipolar transistors described may be replaced with pnp type bipolar transistors providing circuits, in which currents flow in the opposite direction. Furthermore, the Si bipolar transistors in the above explanation may be replaced with GaAs or InP series HBT. Further, except use for the purpose of obtaining an output current varying with an exponential function for an input voltage, other kind of transistor such as MOSFET, CMOS, GaAs, MESFET, or HEMT is used without deviating from the object of the present invention insofar as not changing the basic operation of circuit.

According to the present invention, as explained above, a pseudo-zero bias driving for a LD can be realized by a temperature dependent constant-current circuit, in which a bias current faithfully follows variation in a temperature of the threshold value and is slightly smaller than the threshold value with good accuracy. The temperature dependent constant-current circuit according to the present invention enables to independently adjusting a portion of the bias current, which varies with a temperature and has a large non-linearity, and a portion independent from a temperature by dividing the bias current into the two portions respectively.

Further, the constant-current generating circuit according to the present invention can be also used for compensating the temperature dependency of the LD laser intensity having a high characteristic temperature by changing the circuit constant.

What is claimed is:

1. A temperature dependent constant-current generating circuit comprising a stabilized voltage generating circuit including a reference voltage source for supplying a predetermined reference voltage, a plurality of voltage dividing circuits for dividing said reference voltage, a plurality of current amplifier circuits including a transistor having a base or gate electrode, which is provided with an output voltage of said voltage dividing circuits and having an emitter or a source electrode, which is connected to a ground, a current mirror circuit for providing an output current having a substantially equal amplitude of a composite current provided by said plurality of current amplifier circuits and flowing in an opposite direction to said composite current, a current-voltage conversion resistor, which is provided with the output current of said current mirror circuit, which generates a voltage proportional to said amplitude of the output current of said current mirror circuit, and which adds said voltage to the output voltages of said stabilized voltage generating circuit, and an output amplifier circuit to which said added voltages generated by said current-voltage conversion resistor are supplied, wherein said output amplifier circuit is composed of an output transistor having a base or gate electrode, which is provided with said added voltage outputs generated by said current-voltage conversion resistor and said transistor having an emitter or source electrode, to which a feedback resistor is connected and said transistor having a collector or drain electrode, from which an output current is take out from said output transistor.

2. A temperature dependent constant-current generating circuit according to claim 1, wherein said plurality of current amplifier circuits generate currents dependent on an ambient temperature respectively.

3. A temperature dependent constant-current generating circuit according to claim 1, wherein said plurality of voltage dividing circuits have different voltage dividing ratios respectively, thereby adjust temperature dependent characteristic s of said plurality of current amplifier circuits.

4. A temperature dependent constant-current generating circuit according to claim 1, wherein either a resistance of said current-voltage conversion resistor or at least one of the voltage dividing ratios of said voltage dividing circuits is variable.

5. A temperature dependent constant-current generating circuit according to claim 3, wherein said plurality of current amplifier circuits have different temperature dependent characteristics in different temperature ranges respectively.

6. A temperature dependent constant-current generating circuit according to claim 1, wherein said current mirror circuit is composed of transistors complementary to said transistors constituting said plurality of current amplifier circuits and supplies said current-voltage conversion resistor with a mirror-reversed current generated by said current mirror circuit.

7. A temperature dependent constant-current generating circuit comprising a stabilized voltage generating circuit including a reference voltage source for supplying a predetermined reference voltage, a first voltage dividing circuit for dividing said reference voltage, a first current amplifier circuit including a transistor having a base or gate electrode, which is provided with an output voltage of said first voltage dividing circuits and having an emitter or a source electrode, which is connected to a ground, a second voltage dividing circuit for dividing said reference voltage, a second current amplifier circuit including a transistor having a base or gate electrode, which is provided with an output voltage of said second voltage dividing circuits and is connected to a ground, a current mirror circuit for providing an output current having a substantially equal amplitude of a composite current provided by said first and second current amplifier circuits and flowing in an opposite direction to said composite current, a current-voltage conversion resistor, which is provided with the output current of said current mirror circuit, which generates a voltage proportional to said amplitude of the output current of said current mirror circuit, and which adds said voltage to the output voltages of said stabilized voltage generating circuit, and an output amplifier circuit to which said added voltages generated by said current-voltage conversion resistor are supplied, wherein said output amplifier circuit is composed of an output transistor having a base or gate electrode, which is provided with said added voltage outputs generated by said current-voltage conversion resistor and said transistor having an emitter or source electrode, to which a feedback resistor is connected and said transistor having a collector or drain electrode, from which an output current is take out from said output transistor.

8. A temperature dependent constant-current generating circuit according to claim 7, wherein said plurality of current amplifier circuits generate currents dependent on an ambient temperature respectively.

9. A temperature dependent constant-current generating circuit according to claim 7, wherein said plurality of voltage dividing circuits are set to different voltage dividing ratios respectively, thereby adjust temperature dependent characteristic s of said plurality of current amplifier circuits.

10. A temperature dependent constant-current generating circuit according to claim 7, wherein either a resistance of said current-voltage conversion resistor or at least one of the voltage dividing ratios of said voltage dividing circuits is variable.

11. A temperature dependent constant-current generating circuit according to claim 9 or 10, wherein said plurality of current amplifier circuits have different temperature dependent characteristics in different temperature ranges respectively.

12. A temperature dependent constant-current generating circuit according to claim 1, wherein said current mirror circuit is composed of transistors complementary to said transistors constituting said plurality of current amplifier circuits and supplies said current-voltage conversion resistor with a mirror-reversed current generated by said current mirror circuit.

13. A temperature dependent constant-current generating circuit comprising a stabilized voltage generating circuit including a reference voltage source for supplying a predetermined reference voltage, a first voltage dividing circuit for dividing said reference voltage, a first current amplifier circuit including a transistor having a base or gate electrode, which is connected with an output terminal of said first voltage dividing circuits and having an emitter or a source electrode, which is connected to a ground, a second voltage dividing circuit for dividing said reference voltage, a second current amplifier circuit including a transistor having a base or gate electrode, which is connected with an output terminal of an output voltage of said second voltage dividing circuits and having an emitter or a source electrode, which is connected to a ground, a current mirror circuit for providing an output current having a substantially equal amplitude of a composite current provided by said first and second current amplifier circuits and flowing in an opposite direction to said composite current, a current-voltage conversion resistor, one end of which is connected with an output terminal of said current mirror circuit, and the other end of which is connected to an output terminal of said stabilized voltage generating circuit, a buffer amplifier circuit having an input terminal, which is supplied with a voltage generated at said one end of the current-voltage conversion resistor, and an output amplifier circuit, which is connected to an output terminal of said buffer amplifier circuit, wherein said output amplifier circuit is composed of an output transistor having a base or gate electrode, which is provided with said added voltage outputs generated by said current-voltage conversion resistor and said transistor having an emitter or source electrode, to which a feedback resistor is connected and said transistor having a collector or drain electrode, from which an output current is take out from said output transistor.

14. A temperature dependent constant-current generating circuit comprising a stabilized voltage generating circuit including a reference voltage source for supplying a predetermined reference voltage, a first voltage dividing circuit for dividing said reference voltage, a first current amplifier circuit including a transistor having a base or gate electrode, which is connected with an output terminal of said first voltage dividing circuits and having an emitter or a source electrode, which is connected to a ground, a second voltage dividing circuit for dividing said reference voltage, a second current amplifier circuit including a transistor having a base or gate electrode, which is connected with an output terminal of an output voltage of said second voltage dividing circuits and having an emitter or a source electrode, which is connected to a ground, a current-voltage conversion resistor, which is provided with a composite current provided by said first and second current amplifier circuits thereby generating a voltage proportional to the composite current and adding the voltage to an output voltage of said stabilized voltage generating circuit, an output transistor having an base or gate electrode, which is provided with said added voltage outputs generated by said current-voltage conversion resistor, and a feedback resistor, which is connected to an emitter or source electrode of said output transistor, wherein an output current is taken out from a collector or drain electrode of said output transistor.

15. A temperature dependent constant-current generating circuit according to claim 14, wherein said plurality of current amplifier circuits generate currents dependent on an ambient temperature respectively.

16. A temperature dependent constant-current generating circuit according to claim 14, wherein said plurality of voltage dividing circuits have different voltage dividing ratios respectively, thereby adjust temperature dependent characteristic s of said plurality of current amplifier circuits.

17. A temperature dependent constant-current generating circuit according to claim 14, wherein either a resistance of said current-voltage conversion resistor or at least one of the voltage dividing ratios of said voltage dividing circuits is variable.

18. A temperature dependent constant-current generating circuit according to claim 16 or 17, wherein said plurality of current amplifier circuits have different temperature dependent characteristics in different temperature ranges respectively.

19. A temperature dependent constant-current generating circuit according to claim 14, wherein said transistors included in said plurality of current amplifier circuits are transistors complementary to said output transistors included in said output amplifier circuit and said plurality of current amplifier circuits supply an amplified output current to said current-voltage conversion resistor.

20. A temperature dependent constant-current generating circuit comprising a stabilized voltage generating circuit including a reference voltage source for supplying a predetermined reference voltage, a first voltage dividing circuit for dividing said reference voltage, a first current amplifier circuit including a transistor having a base or gate electrode, which is connected with an output terminal of said first voltage dividing circuits and having an emitter or a source electrode, which is connected to a ground, a second voltage dividing circuit for dividing said reference voltage, a second current amplifier circuit including a transistor having a base or gate electrode, which is connected with an output terminal of an output voltage of said second voltage dividing circuits and is connected to a ground, a current-voltage conversion resistor, one end of which is connected with an output terminal of said first and second current amplifier circuits and the other end of which is connected to an output terminal of said stabilized voltage generating circuit, a buffer amplifier circuit having an input terminal, which is supplied with a voltage generated at said one end of the current-voltage conversion resistor, and an output amplifier circuit, which is connected to an output terminal of said buffer amplifier circuit, wherein said output amplifier circuit is composed of an output transistor having a base or gate electrode, which is provided with said added voltage outputs generated by said current-voltage conversion resistor and said transistor having an emitter or source electrode, to which a feedback resistor is connected and said transistor having a collector or drain electrode, from which an output current is take out from said output transistor.

21. A temperature dependent constant-current generating circuit according to claim 20, wherein an amplifier circuit with a collector or drain electrode is grounded is inserted between said output terminal of said buffer amplifier circuit and said base or gate electrode of said transistor of said output amplifier circuit.

22. A temperature dependent constant-current generating circuit according to claim 20, wherein either a resistance of said current-voltage conversion resistor or at least one of the voltage dividing ratios of said voltage dividing circuits is variable.

* * * * *